United States Patent [19]

Kosugi

[11] Patent Number: 4,682,037
[45] Date of Patent: Jul. 21, 1987

[54] PROJECTION EXPOSURE APPARATUS HAVING AN ALIGNMENT LIGHT OF A WAVELENGTH OTHER THAN THAT OF THE EXPOSURE LIGHT

[75] Inventor: Masao Kosugi, Yokohama, Japan

[73] Assignee: Canon Kabushiki Kaisha, Tokyo, Japan

[21] Appl. No.: 753,258

[22] Filed: Jul. 9, 1985

[30] Foreign Application Priority Data

Jul. 10, 1984 [JP] Japan ............... 59-143465
Aug. 15, 1984 [JP] Japan ............... 59-169205

[51] Int. Cl.⁴ ............... G01B 11/00; G01J 1/20
[52] U.S. Cl. ............... 250/548; 250/201; 356/400
[58] Field of Search ............... 356/400, 401; 250/201 AF, 548, 557

[56] References Cited

U.S. PATENT DOCUMENTS

3,897,138  7/1975  Kano .
4,062,623 12/1977  Suzuki et al. ............... 356/401
4,232,969 11/1980  Wilczynski ............... 356/401
4,269,505  5/1981  Mayer ............... 250/548
4,357,100 11/1982  Mayer et al. .
4,492,459  1/1985  Omata .

*Primary Examiner*—Edward P. Westin
*Assistant Examiner*—Charles Wieland
*Attorney, Agent, or Firm*—Fitzpatrick, Cella, Harper & Scinto

[57] ABSTRACT

A projection exposure apparatus for projecting a pattern of a mask onto a semiconductor wafer through a projection optical system including plural refracting surfaces, and for irradiating the mask with a wavelength of light suitable for assuring optimum projection performances of the projection optical system to expose the wafer to the pattern of the mask, wherein at least one of the refracting surfaces of the projection optical system is provided with an interference film having an antireflection function relative to the wavelength of the light for the exposure of the mask, and having a predetermined reflection factor relative to a wavelength of light different from that of the exposure light, whereby the positional relation between the mask and the wafer can be detected through the projection optical system with the wavelength of light other than that of the exposure light.

13 Claims, 9 Drawing Figures

PROJECTION EXPOSURE APPARATUS HAVING AN ALIGNMENT LIGHT OF A WAVELENGTH OTHER THAN THAT OF THE EXPOSURE LIGHT

BACKGROUND OF THE INVENTION

This invention relates to a projection exposure apparatus and, more particularly, to a projection exposure apparatus usable in the manufacture of semiconductor devices such as integrated circuits and for projecting a pattern of a photomask or reticle onto a semiconductor wafer through a projection optical system including a plurality of refracting surfaces.

Projection exposure apparatuses are well known in the field of manufacturing semiconductor devices. In such projection exposure apparatuses, a circuit pattern formed on a photomask or reticle (which hereinafter will be referred to simply as "mask") is projected onto a semiconductor wafer at a real magnification or a reduced scale through a projection lens system whose aberrations are corrected with respect to a predetermined wavelength of light. By irradiating the mask with the predetermined wavelength of light, the wafer is exposed to the pattern of the mask. As is well known in the art, each of the semiconductor devices is manufactured by superposing exposures of the same wafer to different patterns formed on separate masks. In the projection exposure apparatuses, therefore, it is necessary to preparatively detect, prior to each exposure, the positional relation between the pattern or patterns which have already been printed on the wafer and the pattern of the mask which is going to be projected by the projection lens system, and, if the positional relation therebetween is out of a predetermined state, then it is necessary to correct the positional error. The positional relation to be detected includes a relation between the mask pattern and the wafer surface in a direction along the optical axis of the projection lens (which relation will hereinafter be called "focus relation") and a relation, in a plane perpendicular to the optical axis of the projection lens, between the mask pattern and the pattern or patterns which have already been printed on the wafer (which relation will hereinafter be called "alignment relation").

From viewpoints of accuracies of detection and reduction in time of detection, it is preferable to detect such positional relation through the projection lens system, which is called a through-the-lens (TTL) system. However, since, a refraction optical system such as the projection lens system shows different imaging performances for different wavelengths of light, as compared with a reflection optical system, it involves difficulties to effect the above-described detection by means of the projection lens whose aberrations have been corrected to provide optimum imaging performances only relative to the wavelength of light exposing the wafer to the mask pattern. A proposal has been made in IBM Technical Disclosure Bulletin Vol. 18, No. 2, pp. 385 and 386 published July 1975. According to this proposal, the same wavelength of light is used for the exposure and for the detection of the positional relation. This may be preferable because of its simplicity. However, in some cases of recent semiconductor device manufacturing processes, the wafer surface is subjected to an anti-reflection treatment with respect to the exposure light or an absorption promoting agent is added to or incorporated into a sensitizing agent, in order to obtain better printing characteristics. In these cases, no reflection light or only little reflection light is obtainable from the wafer surface. As the result, the detection of the positional relation would be very difficult to execute, in accordance with the above proposal.

Other proposals, such as the following, have been made, directed at the detection of the positional relation with a wavelength of light other than that for the exposure.

Proposal A: To use a projection lens whose aberrations have been corrected relative to both of two different wavelengths of the exposure light and the detection light.

Proposal B: To use an additional optical system such as a lens, a parallel flat plate, a mirror, etc. which is provided separately from the projection lens and is disposed outside the path of the exposure light. This additional optical system is employed to change the optical path length for the detection light. Examples are disclosed in U.S. Pat. Nos. 4,357,100 and 4,492,459 issued Nov. 2, 1982 and Jan. 8, 1985, respectively.

Proposal C: To replace a part of the plural lens components of the projection lens system arranged for the exposure, by an additional element or elements for the sake of detection of the positional relation. An example is disclosed in U.S. Pat. No. 3,897,138 issued July 29, 1975.

Proposal D: To change, upon detection, the position of the wafer in the direction of the optical axis of the projection lens, as compared with the position of the wafer, upon its exposure. An example is disclosed in Japanese Patent Application Laid-Open May 25, 1984, Laid-Open No. 90929/1984.

Proposal E: To provide, on the wafer surface, a mark such as a Fresnel mark for converging the detection light toward a predetermined point. On the basis of the thus converged light, the positional relation is detected.

With these proposals, however, there still remain the various following inconveniences.

As regards the proposal A, it involves difficulties to make such a lens system which is corrected relative to both of the two wavelengths. Second, as the difference between the two wavelengths gets larger, there occurs a larger amount of focus displacement depending on variations in the wavelength, particularly in a range near the exact wavelength for the exposure. In other words, the depth of focus becomes smaller. As the result, it is very difficult to assure sufficient printing performances if the exposure light is not provided by a beam having an absolutely single wavelength, such as a laser beam, that is, if the exposure light is provided by a beam having a spectrum range.

As regards the proposal B, if the additional optical system is fixed, it limits the positions of detection marks formed on the mask and wafer for the sake of detection of the positional relation (particularly the alignment relation). Also, it adversely affects the size and/or shape of the pattern (actual device pattern) to be formed on the mask. If, on the other hand, the additional optical system is made retractable to a position which does not adversely affect the exposure light upon exposure, substantial time is required for such retracting movement. Further, a complicated mechanism is required to maintain the positional accuracies of the movable additional optical system.

With regard to the proposal C, additional time is necessary for the movement or replacement of the lens components. Also, it involves a problem of positional accuracies for the replaceable lens elements.

With respect to the proposal D, additional time is required for the movement of the wafer. Further, the following problem occurs. That is, if the projection lens system has been corrected relative to the exposure wavelength only, and when such a wavelength of light other than the exposure wavelength is incident on the projection lens system, the image formed in an image plane defined by the second-mentioned wavelength other than the exposure wavelength is not so reliable. This is because the aberrations of the projection lens system have not been corrected relative to the second-mentioned wavelength. If, therefore, the mask is provided with a detection mark for the sake of detection of the positional relation (particularly the alignment relation), an exactly correct image of the detection mark is not obtainable of the wafer (even if the wafer is displaced to an in-focus position). This leads to a possibility of failure of accurate detection of the positional relation.

As regards the proposal E, a complicated mark has to be formed on the wafer. Therefore, it is not advantageously applicable to step-and-repeat reduction exposure apparatuses which are usable with such a wafer having actual device patterns each formed with plural detection marks.

SUMMARY OF THE INVENTION

It is accordingly a primary object of the present invention to provide a projection exposure apparatus by which through-the-lens detection of the positional relation between two members is attainable with a wavelength different from that for exposing one of the two members.

Briefly according to the present invention, there is provided a projection exposure apparatus for projecting a pattern of a mask onto a semiconductor wafer through a projection optical system including plural refracting surfaces and for irradiating the mask with a wavelength of light suitable for assuring optimum projection performance of the projection optical system to expose the wafer to the pattern of the mask, wherein at least one of the refracting surfaces of the projection optical system is provided with an interference film or coating having an anti-reflection function relative to the wavelength of light for the exposure of the wafer and having a predetermined reflection factor relative to a wavelength of light different from that of the exposure light, whereby the positional relation between the mask and the wafer can be detected through the projection optical system with the wavelength of light other than that of the exposure light.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Hereinafter, the invention will be described with reference to step-and-repeat type projection exposure apparatuses, called steppers, wherein a pattern of a mask is projected at a reduced scale onto a semiconductor wafer through a projection lens having plural lens components and, in combination with step-and-repeat exposures, a plurality of patterns each corresponding to the pattern of a mask are printed on the wafer. An example of such apparatus is disclosed in Japanese Laid-Open Patent Application laid-open Feb. 15, 1983, Laid-Open No. 25638/1983, filed by the assignee of the subject application.

Figure 1A:
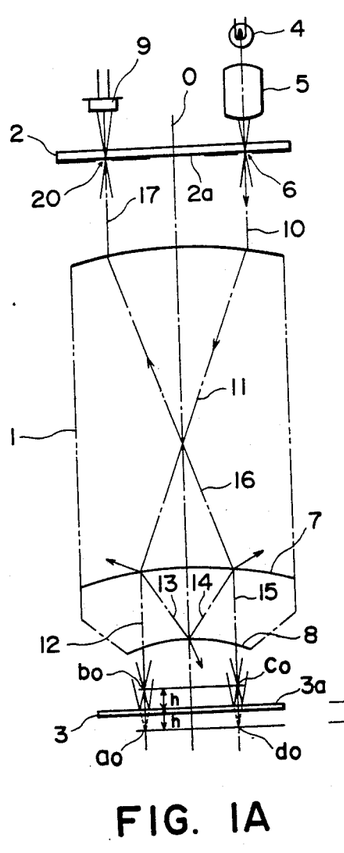
FIGS. 1A and 1B schematically show a projection exposure apparatus according to an embodiment of the present invention.

Referring first to FIG. 1A, there is shown a projection exposure apparatus according to an embodiment of the present invention, which apparatus is arranged to detect the focus relation through a projection lens system thereof.

As shown in FIG. 1A, the projection exposure apparatus includes a reduction projection lens 1. Although the projection lens 1 is schematically illustrated in FIG. 1A, it is actually composed of a combination of single lenses and/or cemented lenses, so that a plurality of refracting surfaces are defined in the projection lens 1. A mask 2 having a pattern formed on its lower surface 2a is disposed above the projection lens 1. Although not shown in the drawing, an illumination system for irradiating the mask 2 with exposure light is provided at a position above the mask 2. A semiconductor wafer 3 having a sensitive surface 3a is located beneath the projection lens 1. In the state of FIG. 1A, the projection lens 1 acts so that the pattern surface 2a of the mask 2 and the sensitive surface 3a of the wafer 3 are in an optically conjugate relation with each other, with respect to the wavelength of the exposure light.

Figure 3A:
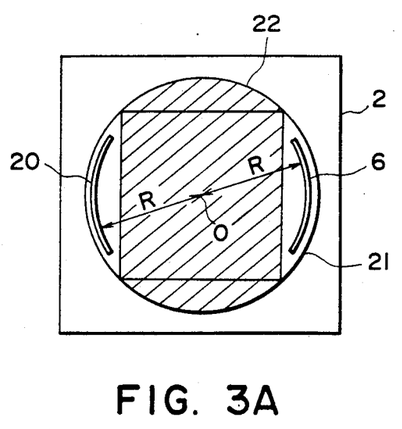
FIG. 3A is a plan view of a mask used in the projection exposure apparatus of FIG. 1A.

The projection exposure apparatus further includes a light source 4 for supplying a light beam for effecting the detection of the focus relation. The wavelength of the light supplied by the light source 4 has a wavelength which is different from that of the exposure light and to which the sensitive surface 3a of the wafer 3 is insensitive. Disposed between the light source 4 and the mask 2 is a condenser lens 5. The mask 2 has formed therein a slot or aperture 6 provided for the sake of focus detection. As shown in FIG. 3A, the aperture 6 has an arcuate shape having a radius R with respect to the optical axis 0 of the projection system 1. In this embodiment of the present invention, as will be described later, the focus relation is detected on the basis of changes in the quantity of light. So, in the preferred embodiment, the aperture 6 is divided into plural arcuate slits such that the quantity of light to be received by a photodetector changes more rapidly with the changes in the focus relation.

Denoted by numerals 7 and 8 are two refracting surfaces of the projection lens 1, respectively. Two mediums on the opposite sides of each of the refracting surfaces 7 and 8 may have the same refractive index or may have different refractive indices. Each of the refracting surfaces 7 and 8 is provided with an interference coating or thin film formed by vacuum deposition or the like. The interference coating has a transmission factor of nearly 100% with respect to the wavelength of the exposure light and, simultaneously therewith, it has a reflection factor which is predetermined so as to retain a maximum amount of residual light in accordance with the ratio of the number or times of reflection and the number or times of transmission. In this embodiment of the present invention, each of the refracting surfaces 7 and 8 has a convexity facing the mask 2 and has a center of curvature which is coincident with the optical axis 0. The refracting surfaces 7 and 8 are arranged such that the detection light travelling from the wafer 3 side transmits through the surface 8, is reflected by the surface 7, then internally reflected by the surface 8, and again reflected by the surface 7. The refracting surfaces 7 and 8 define a one-to-one magnification reflection optical system with an object point and an image point being denoted by characters $b_0$ and $c_0$, respectively, in FIG. 1A. If, in FIG. 1A, a point $a_0$ denotes the position at which an image of the mask 2 is formed by the projection lens 1 with the detection light, and, when the image of the mask 2 with the exposure light is formed on the wafer surface 3a, the point $a_0$ is located at a position spaced downwardly from the wafer surface 3a by a distance or height h, while each of the points $b_0$ and $c_0$ is located at a position spaced upwardly from the wafer surface 3a by the same distance or height h.

In addition to the aperture 6, the mask 2 is provided with a slot or aperture 20 adapted to detect the aperture 6, as will be described later. As shown in FIG. 3A, the aperture 20 has an arcuate shape having the same radius R as the aperture 6 with respect to the optical axis O. Like the aperture 6, the aperture 20 is preferably divided into plural arcuate slits, although not shown in the drawings. A photoelectric converting element 9 is disposed to receive the light passed through the aperture 20. An output produced by the photoelectric transducer 9 is processed by an unshown electric processing circuit, and, in accordance with a signal thus obtained, the wafer 3 is displaced in the direction of the optical axis of the projection lens 1. When the quantity of light passing through the aperture 20 becomes maximum, the wafer 3 is held stationary. While in this embodiment of the present invention both the mask 2 and the projection lens 1 are fixedly secured with respect to the direction of the optical axis, the mask 2 may be displaced in the direction of the optical axis rather than the wafer. Further, the projection lens may be displaced and, as a further alternative, any combination of the mask 2, the projection lens 1 and the wafer 3 may be made displaceable. Alternatively, the apparatus may be arranged such that the wafer is displaced if the focus error is greater than a predetermined reference amount, while the mask is displaced if the focus error is not greater than the predetermined reference amount.

In operation, the light emitted from the light source 4 is converged by the condenser lens 5 and illuminates the focus detecting aperture 6. The light passing through the focus detecting aperture 6 travels along an optical path as denoted by numerals 10 and 11, the optical path corresponding to the chief ray. Then, the light is refractively transmitted through the lens surfaces 7 and 8 and is directed along an optical path 12 to the wafer 3. Since the light directed to the wafer 3 has been affected or acted only by refraction, it is not imaged on the wafer surface 3a which is located in an in-focus position with respect to the exposure light. Rather, the light directed to the wafer surface 3a is in the form of a converging beam advancing toward the point $a_0$. Since the wafer surface 3a can be considered as a mirror surface, the converging beam is focused at the point $b_0$ and then incident on the lens surface 8. Thereafter, the light transmitted through the lens surface 8 is reflected by the surface 7 so that it is directed along an optical path 13. When the light transmitted through the surface 8 is incident on the surface 7, such portion of the light which is not reflected by the interference coating on the surface 7 transmits therethrough, such as denoted by an arrow in FIG. 1A. Since, however, such transmission component is not material to the essence of the present invention, description thereof will be omitted in this Specification. This is also the case with the surface 8.

Figure 3B:
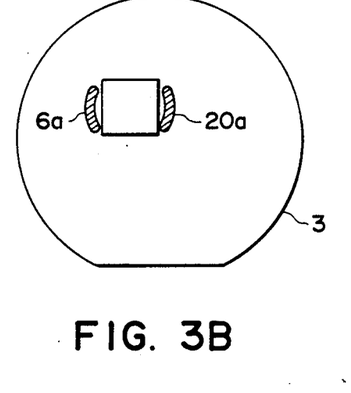
FIG. 3B is a plan view of a wafer introduced into the projection exposure apparatus of FIG. 1A.

The light reflected by the interface 7 is further reflected by the faces 8 and 7 in this order, tracing the optical path as denoted by numerals 13, 14 and 15, and finally it emerges from the projection lens system 1. The light emerging from the projection lens system 1 is first focused at a point $c_0$ and then is incident on the wafer surface 3a. FIG. 3b is a plan view of the wafer 3, wherein hatched areas 6a and 20a correspond respectively to defocused or blurred images of the focus detecting apertures 6 and 20, while a square area corresponds to a region onto which the actual device pattern of the mask is to be projected.

Figure 1B:
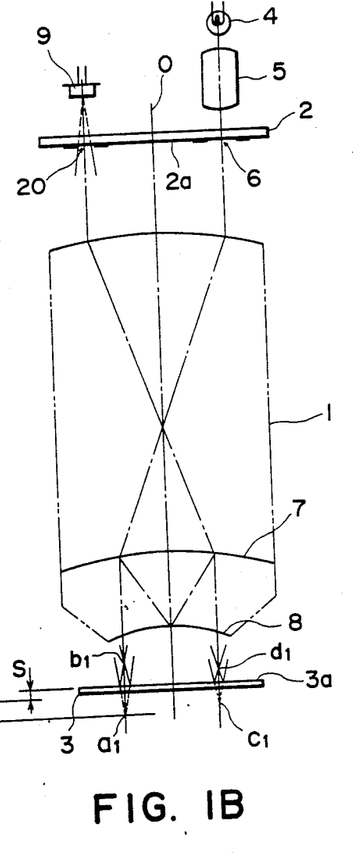

The light incident on the wafer surface 3a is reflected thereby and the reflected light is in a diverging form as if it had diverged from a point $d_0$. The light reflected by the wafer surface 3a goes back along its oncoming path 15 toward the interface 7 by which it is refractively transmitted. The light passing through the face 7 traces an optical path 16 and then emerges from the projection lens system 1 as denoted by numeral 17. The light emerging from the projection lens system 1 enters into the focus detecting aperture 20 of the mask 2 and forms thereon a sharp image of the aperture 6. Accordingly, the photoelectric converting element 9 produces a maximum level output. If, on the other hand, the wafer 3 is out of its correct position (FIG. 1A position), and when it is deviated upwardly by an amount S such as shown in FIG. 1B, a point $b_1$ corresponding to the point $b_0$ of FIG. 1A is displaced from the point $b_0$ by an amount 2S due to the deviation of the wafer surface 3a, although a point $a_1$ corresponding to the point $a_0$ as FIG. 1A is at the same position of the point $a_0$. As the result of the displacement of the point $b_1$, a point $c_1$ corresponding to the point $c_0$ of FIG. 1A is displaced downwardly beyond the wafer surface 3a. Also, a point $d_1$ corresponding to the point $d_0$ of FIG. 1A is deviated from the point $d_0$ approx. by an amount 4S.

This means that, while the light reflected by the wafer surface 3a and focused at the point $d_1$ enters into the projection lens system 1 from below and emerges therefrom in a converging form, it is not imaged in a plane of the lower surface of the mask 2. As the result, only a blurred image of the focus detecting aperture 6 is formed in the plane of the aperture 20, so that only a decreased amount of light is received by the photoelectric converting element 9. In response to the reception of the decreased amount of light by the photoelectric converting element 9, the unshown electronic circuit for processing the output signal of the photoelectric converting element 9 produces a signal for displacing the wafer 3 to move it downwardly, until the output of the photoelectric converting element 9 reaches a maximum level. When the output of the photoelectric converting element 9 reaches the maximum level, the movement of the wafer 3 is stopped. Whether the wafer 3 is to be moved downwardly or upwardly can be determined easily. For example, the system may be arranged such that, after completion of detection, the wafer 3 is moved in a predetermined one of upward and downward directions by a certain amount and that changes in the level of the output of the photoelectric converting element 9 are detected during such movement of the wafer. If the level of the output increases, the movement in the same direction is continued. If, on the other hand, the level of the output decreases, the wafer is moved in the opposite direction. If the level of the output first increases and then decreases, the wafer is moved in the opposite direction. In this manner, the position of the wafer at which the photoelectric converting element 9 produces a maximum level output can be detected. As an alternative, the system may be arranged so that, while moving the wafer 3 upwardly to its initial setting position, the quantity of light passing through the aperture 20 is measured just before the wafer 3 reaches its initial setting position and, when the wafer 3 reaches its initial setting position, the quantity of light passing through the aperture 20 is measured again. From the direction of change in the quantity of light (i.e. increase or decrease), the direction of deviation of the wafer surface 3a, namely whether the wafer surface 3a is deviated upwardly or downwardly, can be detected.

While in this embodiment of the present invention only a single detecting system is provided, two areas on the wafer surface 3a sandwiching the projection area are detectable. More specifically, the positional information on one of the two areas sandwiching the projection area and the positional information on the other area are averaged, and the average (which can be observed at the aperture 20) is picked up as a focus signal. In other words, the average of the positions of the two areas is detected to provide a signal representing the focus relation between the mask 2 and the wafer 3 with respect to the projection lens 1.

This is very preferable, particularly in a case where the wafer surface is inclined. As is known in the art, the inclination or tilt of the surface of the wafer held by a wafer holder is difficult to remove. According to this embodiment of the present invention, even if the wafer surface is inclined, an average of two different positions (in the direction of the optical axis of the projection lens system) of the two areas on the inclined wafer surface is detected as the position of the wafer surface, and the wafer is displaced so that the average position coincides with the correct focus position with respect to the projection lens system. Therefore, the deviations (from the in-focus position) of the positions of the two areas on the wafer surface can be distributed on the opposite sides of the in-focus position in the direction of the optical axis of the projection lens, such that both the two areas on the wafer surface are moved into the range of depth of focus of the projection lens. Whereby the entire surface of the wafer can be positioned within the depth of focus of the projection lens system, irrespective of the inclination of the wafer surface.

Further, in order to allow the projection onto the wafer of an actual device pattern of a generally square shape as shown in FIG. 3A, only such an area 22 as denoted by a hatched region within the effective view field 21 of the projection lens system is necessary. To be exact, only the square region in FIG. 3A is required. Thus, the remaining region of the view field of the projection lens system can be used for the purpose of detection according to the present invention. If the means for relaying the detection light is composed of a reflection optical system such as the interference films 7 and 8 of this embodiment, the object-to-image relation can be established for the same image height. In FIG. 3A, the image height corresponds to the distance from the point O which is coincident with the optical axis of the projection lens system. Since the apertures 6 and 20 are of arcuate shape having the same center coincident with the point O with the same radius R, the object-to-image relation is established anywhere withhin the arcuate apertures 6 and 20. Therefore, within the entire region of the aperture 20, a consistent state of focus is obtainable. This means that, at any point within the aperture 20, the position of the corresponding point on the wafer surface is detectable. Accordingly, the focus signal is obtainable from a wider area on the wafer surface.

In the above-described embodiment, the surfaces 7 and 8 are shown as the two surfaces of the final lens element of the projection lens system 1 or as the cemented lens surface and the final lens surface of the final lens element of the projection lens system 1. However, the surfaces 7 and 8 may be provided by lens surfaces of an internal lens element. Further, the surfaces 7 and 8 may be provided by lens surfaces of separate lens elements.

Figure 2:
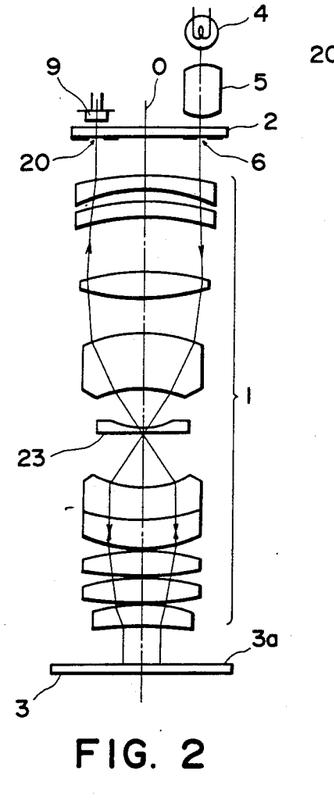
FIG. 2 schematically shows a projection exposure apparatus according to another embodiment of the present invention.

FIG. 2 shows a projection exposure apparatus according to another embodiment of the present invention. In this embodiment, only one surface is coated with an interference thin film.

As shown in FIG. 2, the projection exposure apparatus includes a projection lens system 1 which is of telecentric type with respect to a wafer 3, i.e. of the type in which the principal ray is perpendicularly incident on the surface 3a of the wafer. Preferably, the projection lens system 1 is also telecentric with respect to a mask 2. The projection lens system 1 includes a lens element having a flat surface 23 which is located at the position of a pupil of the lens system 1, i.e. at a position at which the principal ray intersects with the optical axis of the projection lens system 1. The flat surface 23 of the lens element is coated with an interference thin film of dichroic type, by vacuum deposition or the like. With this arrangement, a reflection optical system is defined between the flat surface 23 and the final lens surface of the projection lens system 1. Accordingly, the focus relation between the mask 2 and the wafer 3 can be detected substantially in the same manner as described with reference to the first embodiment of the present invention.

In the foregoing embodiments, the focus relation is detected in accordance with one of two defocus detecting techniques. However, the invention is not limited thereto, and other detecting techniques are applicable.

Figure 4:
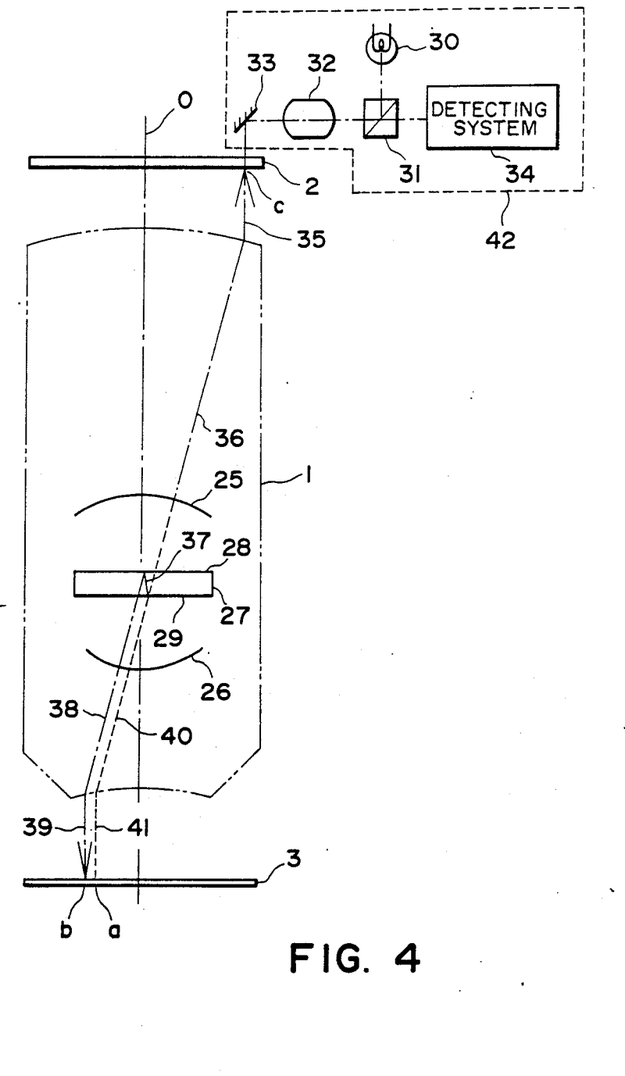
FIG. 4 is a schematic and diagrammatic view showing a projection exposure apparatus according to a further embodiment of the present invention.

Referring now to FIG. 4, description will be made to a projection exposure apparatus according to a further embodiment of the present invention, wherein the invention is applied to detection of the alignment relation between a mask and a wafer.

In this embodiment of the present invention, similarly to the foregoing embodiments, a reflection surface reflective to a wavelength of light different from that for exposing the wafer is incorporated into a projection lens system of the projection apparatus which lens system is corrected relative to the wavelength of the exposure light. The reflection surface can be easily formed on the surface of a particular element of the projection lens system, by effectively utilizing currently available coating techniques. More specifically, in this embodiment of the present invention, the lens surface of the projection lens system has a coating which provides a maximum transmission factor relative to the wavelength of the exposure light, whereas a surface of an element to be utilized as the reflection surface has formed thereon a coating which provides a suitable reflection factor relative to the wavelength of the alignment detecting light while it maintains a higher transmission factor relative to the wavelength of the exposure light. A desired transmission-factor/reflection-factor of the coating is easily obtainable, by utilizing the currently established coating techniques. For example, the desired transmission-factor/reflection-factor is attainable by adjusting the thickness of coating.

The projection exposure apparatus shown in FIG. 4 includes a projection lens system 1 of dualtelecentric type. The projection lens system 1 includes lens surfaces 25 and 26, and an afocal system is defined between these lens surfaces 25 and 26. Disposed between the lens surfaces 25 and 26 is a parallel flat plate 27 which is provided to change the state of polarization, to thereby clearly separate, from the light reflected by the surface of a mask, the light reflected by the surface of a wafer and directed to the mask. An example of such a parallel flat plate is disclosed in Japanese Laid-Open Patent Application, Laid-Open No. 25638/1984 as described hereinbefore.

In this embodiment of the present invention, each of two surfaces 28 and 29 of the parallel flat plate 27 is provided with a coating which is transmissive to the exposure light but is reflective, at a predetermined reflection factor, to the alignment detection light having a wavelength different from that of the exposure light.

A light source 30 is provided to supply the alignment detection light which is incident on a half prism 31. A portion of the alignment detecting light is reflected by the half prism 31 toward an objective 32. The alignment detecting light passed through the objective 32 is reflected by a mirror 33 and is incident on a mask 2. A portion of the light incident on the mask 2 is reflected thereby and goes back along its oncoming path. The remaining portion of the alignment detecting light incident on the mask 2 is transmitted through the mask 2 and directed to the parallel flat plate 27 along an optical path as denoted by numerals 35 and 36.

As described hereinbefore, the glass surfaces 28 and 29 of the parallel flat plate 27 have coatings each of which is transmissive to the wavelength of the exposure light and is reflective, at the predetermined reflection factor, to the wavelength of the alignment detecting light. If, therefore, the light coming along the optical path 36 is the exposure light, it is transmitted by the parallel flat plate 27 and directed toward the wafer 3 along an optical path as denoted by numerals 40 and 41. Finally, the exposure light is focused on a point a in an upper surface of the wafer 3. If, on the other hand, the light coming along the optical path 36 is the alignment detecting light, it is partially reflected and partially transmitted by the glass surfaces 28 and 29. More specifically, only such a portion of the alignment detecting light that has been transmitted through the surface 28, reflected by the surfaces 29 and 28 in this order, and transmitted through the surface 29 is directed toward the wafer 3 along an optical path as denoted by numerals 37, 38 and 39. The alignment detecting light advancing along the optical path 39 is incident on a point b on the upper surface of the wafer 3. By suitably selecting the thickness of the parallel flat plate 27, a predetermined optical path difference is established relative to the alignment detecting light having a particular wavelength. Therefore, the alignment detecting light can be focused on the point b on the upper surface of the wafer 3. The wafer 3 has on its upper surface an alignment mark formed at a position corresponding to the position b. The alignment detecting light incident on the alignment mark of the wafer 3 formed at the position b is reflected thereby and goes back to the mask 2 along its on-coming path as denoted by numerals 39, 38, 37, 36 and 35. Then, the alignment detecting light is focused on a point c on the mask 2.

In this manner, both the alignment mark formed on the mask 2 and the alignment mark on the wafer 3 which is imaged by the projection lens system 1 can be observed simultaneously by the alignment optical system 42. The light reflected by the mask 2 surface and the light incident on the point c are directed, in a clearly separated state due to difference in the polarization, to a detecting system 34 by a mirror 33, lens 32 and half mirror 31, and they are processed by the detecting system 34 in a known manner.

Figures 5, 6A, 6B:
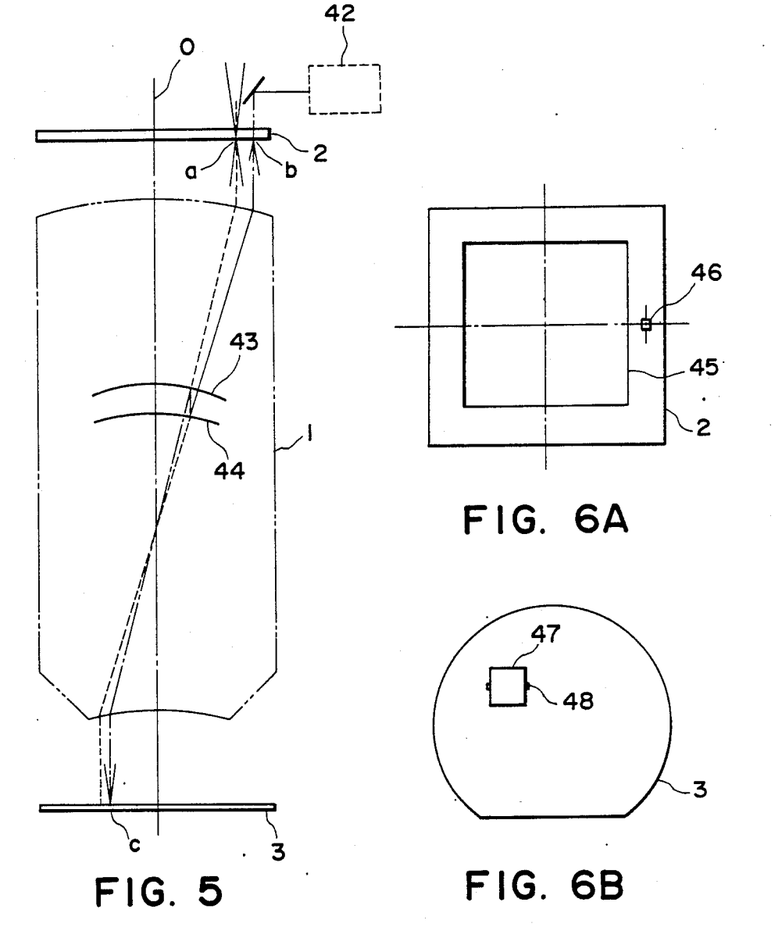
FIG. 5 is a schematic and diagrammatic view showing a projection exposure apparatus according to a still further embodiment of the present invention.
FIG. 6A is a plan view of a mask used in the projection exposure apparatus of FIG. 5.
FIG. 6B is a plan view of a wafer introduced into the projection exposure apparatus of FIG. 5.

FIG. 5 shows a modification of the FIG. 4 embodiment. In this modification, as shown in FIG. 5, the reflection surfaces are formed on two refracting or lens surfaces 43 and 44 of the projection lens system 1 which lens surfaces participate in the image formation. These reflection surfaces 43 and 44 are adapted to correct the imaging with the alignment detection light, so that a point c on the wafer 3, which is optically conjugate with a point a on the mask 2 with respect to the wavelength of the exposure light, comes into an optically conjugate relation with a point b on the mask 2. Therefore, when the actual device pattern in a region 45 on the mask 2 (FIG. 6A) is to be projected onto a region 47 of the wafer 3 (FIG. 6B), an alignment mark 46 for the mask 2 can be formed at a position spaced from the pattern region 45 of the mask 2, whereas a corresponding alignment mark 48 for the wafer 3 is located at a position in close proximity to the region 47. This eliminates the necessity of any retracting movement of the alignment detecting optical system from its optical path after completion of the alignment operation and before the start of the exposure operation. As the result, the alignment operation can be followed by the exposure operation without any loss of time.

In accordance with the present invention, as has hitherto been described, the focus relation and/or the alignment relation can be detected through a refraction type projection optical system which is corrected relative to the wavelength of the exposure light, and with the use of a wavelength of light different from the wavelength of the exposure light. And this detection can be achieved without the necessity of any additional optical system which is not requisite for the exposure, without the necessity of replacement of any optical elements at the time of detection, and without adversely affecting the layout of the circuit pattern of the mask. For these reasons, if the invention is applied to a step-and-repeat type projection exposure apparatus, a higher throughput is assured.

Further, according to the present invention, the detection of the focus relation and/or the alignment relation can be accomplished while the mask, the projection optical system and the wafer are located in their places. This is surely effective to prevent detection error. In addition, since the positional relation is detected from areas on the wafer which are very close to the projection area, the roughness of the wafer surface would not adversely affect the detection accuracy. If the detection position is remote from the exposure position, it is possible that the difference in height between the detection position and the exposure position due to the roughness of the wafer surface adversely affects the detection of the positional relation, so that the exposure position is out of the range of depth of focus of the projection optical system, though the result of detection shows an in-focus state. Such problem is deleted by the present invention. Moreover, in the present invention, the information light is obtainable from a wider area, which effectively prevents failure of detection due to irregular reflection of light caused by the surface unevenness of the wafer.

According to another aspect of the present invention, different and spaced points are defined on the mask which points are optically conjugate with the same point on the mask with respect to the wavelengths of the exposure light and the alignment detection light. This provides that an alignment mark for the mask maybe formed at a position spaced away from the actual device pattern, the alignment mark corresponding to the wafer alignment mark being formed at a position very close to the projection area on the wafer. This eliminates any restriction to the layout of the circuit pattern of the mask. Additionally, there is no necessity of retracting the alignment detecting optical system after completion of the alignment operation and prior to the start of the exposure operation.

While the invention has been described with reference to the structures disclosed herein, it is not confined to the details set forth and this application is intended to cover such modifications or changes as may come within the purposes of the improvements or the scope of the following claims.

What is claimed is:

1. An apparatus for exposing, with light of a first wavelength, a second member to a pattern of a first member, so as to transfer the pattern of the first member onto the second member, said apparatus comprising:
   means for irradiating the first member with the light of the first wavelength;
   means for producing light of a second wavelength different from the first wavelength;
   projecting means for optically projecting, onto the second member, an image of the pattern of the first member irradiated with the light of the first wavelength from said irradiating means, said projecting means having an optical characteristic in which aberration is corrected with respect to the light of the first wavelength, said projecting means having a refracting surface for refracting the light of the first wavelength, and said refracting surface having a predetermined reflection factor with respect to the light of the second wavelength; and
   adjusting means effective to bring the second member and the projected image of the pattern of said first member into a predetermined positional relation, the positional relation being determined using the light of the second wavelength having been reflected by said refracting surface of said projecting means.

2. An apparatus according to claim 1, wherein said refracting surface of said projecting means has a center of curvature which is coincident with the optical axis of said projecting means.

3. An apparatus according to claim 1, wherein said refracting surface of said projecting means extends perpendicularly to the optical axis of said projecting means.

4. An apparatus according to claim 1, wherein said adjusting means adjusts the positional relation between the second member and the projected image of the pattern of said first member in a direction of the optical axis of said projecting means.

5. An apparatus according to claim 1, wherein said adjusting means adjusts the positional relation between the second member and the projected image of the pattern of said first member in a plane perpendicular to the optical axis of said projecting means.

6. An apparatus according to claim 1, wherein said projecting means includes plural refracting surfaces each having a predetermined reflection factor with respect to the light of the second wavelength.

7. An apparatus according to claim 6, wherewithin said plural refracting surfaces of said projecting means are arranged to define a one-to-one magnification reflection system.

8. An apparatus according to claim 1, wherein said projecting means has a pupil located therewithin and is telecentric with respect to the second member, and wherein said refracting surface is disposed in proximity to said pupil of said projecting means.

9. An apparatus according to claim 1, wherein the light produced by said producing means is reflected by the second member at plural times.

10. A projection apparatus for projecting an image of a first object onto a second object, said apparatus comprising:
    projecting means for optically projecting the image of the first object onto the second object by use of light having a first wavelength, said projecting means having a plurality of refracting surfaces each for refracting the light of the first wavelength, and each of said refracting surfaces having a reflecting function with respect to light of a second wavelength different from the first wavelength; and
    adjusting means effective to bring said second object and the image of the pattern of the first object, projected by the projecting means with the light of the first wavelength, into a predetermined positional relation, and said adjusting means having a detector for detecting the light of the second wavelength reflected by said refracting surfaces to pass through said projecting means.

11. An apparatus according to claim 10, wherein said projecting means includes an optical member through which the light of the first wavelength passes, and wherein said refracting surfaces are provided on said optical member.

12. A projection apparatus, comprising:
    an optical system effective to bring a first predetermined point on a first object and a second predetermined point on a second object into an optically conjugate relation with each other with respect to light of a first wavelength, said optical system having a refracting surface for refracting the light of the first wavelength; and means for bringing the first predetermined point on the first object and a third point on the second object, different from the second predetermined point thereon, into an optically conjugate relation with each other with respect to light of a second wavelength, different from the first wavelength, said means including a layer provided on said refracting surface of said optical system and having a predetermined reflecting function with respect to the light of the second wavelength.

13. An apparatus according to claim 12, wherein said layer is effective to transmit substantially all of the light of the first wavelength when it is incident on said layer.

* * * * *

UNITED STATES PATENT AND TRADEMARK OFFICE
CERTIFICATE OF CORRECTION

PATENT NO. : 4,682,037

DATED : July 21, 1987

INVENTOR(S) : MASAO KOSUGI

It is certified that error appears in the above-identified patent and that said Letters Patent is hereby corrected as shown below:

COLUMN 1

Line 49, "since, a" should read --since a--.

COLUMN 2

Line 39, "various following" should read --following various--.

COLUMN 6

Line 52, "as" should read --as shown--.

COLUMN 7

Line 31, "direction" should read --detection--.

COLUMN 8

Line 19, "withhin" should read --within--.
    Line 64, "made to" should read --made of--.

COLUMN 9

Line 26, "dualtelecentric" should read --dual-telecentric--.

COLUMN 10

Line 20, "on-coming" should read --oncoming--.

UNITED STATES PATENT AND TRADEMARK OFFICE
CERTIFICATE OF CORRECTION

PATENT NO. : 4,682,037

DATED : July 21, 1987

INVENTOR(S) : MASAO KOSUGI

It is certified that error appears in the above-identified patent and that said Letters Patent is hereby corrected as shown below:

COLUMN 11

Line 32, "maybe" should read --may be--.

COLUMN 12

Line 27, "wherewithin" should read --wherein--.

Signed and Sealed this

First Day of December, 1987

Attest:

DONALD J. QUIGG

Attesting Officer      Commissioner of Patents and Trademarks